United States Patent
Ogata

(10) Patent No.: US 6,599,795 B2
(45) Date of Patent: Jul. 29, 2003

(54) METHOD OF MANUFACTURING SEMICONDUCTOR DEVICE INCLUDING A STEP OF FORMING A SILICIDE LAYER, AND SEMICONDUCTOR DEVICE MANUFACTURED THEREBY

(75) Inventor: Tamotsu Ogata, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 73 days.

(21) Appl. No.: 09/775,713

(22) Filed: Feb. 5, 2001

(65) Prior Publication Data

US 2002/0019090 A1 Feb. 14, 2002

(30) Foreign Application Priority Data

Aug. 7, 2000 (JP) .......................................... 2000-238525

(51) Int. Cl.[7] .......................................... H01L 21/8242
(52) U.S. Cl. .......................................... 438/241; 438/683
(58) Field of Search ............................ 438/241, 683, 438/FOR 212, FOR 189, FOR 196

(56) References Cited

U.S. PATENT DOCUMENTS

| | | | |
|---|---|---|---|
| 5,668,024 A | * | 9/1997 | Tsai et al. |
| 6,174,774 B1 | * | 1/2001 | Lee |
| 6,218,235 B1 | * | 4/2001 | Hachisuka et al. |
| 6,258,648 B1 | * | 7/2001 | Lee |
| 6,261,898 B1 | * | 7/2001 | Wu |
| 6,277,683 B1 | * | 8/2001 | Pradeep et al. |
| 6,287,907 B1 | * | 9/2001 | Ito et al. |
| 6,287,911 B1 | * | 9/2001 | Nobusawa |

FOREIGN PATENT DOCUMENTS

| | | |
|---|---|---|
| JP | 11-17129 | 1/1999 |
| JP | 11-340433 | 12/1999 |

* cited by examiner

Primary Examiner—George Fourson
Assistant Examiner—Joannie Adelle Garcia
(74) Attorney, Agent, or Firm—McDermott, Will & Emery

(57) ABSTRACT

A gate insulating film 2 is formed on a DRAM circuit region 11 and a logic circuit region 12 of a semiconductor substrate, and gate electrodes 3 are formed on the gate insulating film 2. Sidewalls of the gate electrodes 3 are oxidized. A first insulating film 4 is formed all over the semiconductor substrate 1. A sidewall insulating film 41 made of a first insulating film 4 is leaved on the both sides of the gate electrodes 3. A diffusion layer 5 is formed in the semiconductor substrate 1 by implanting ions with the first insulating film 4 and the sidewall insulating film 41 as a mask. A protection film 6 is formed on the first insulating film 4 in the DRAM circuit region 11 and on the logic circuit region 12 except for specific regions 51 of the diffusion layer 5 around certain gate electrodes 3a. A silicide layer 7 is formed in an upper layer portion of the diffusion layer 5 by a salicide technique. The protection film 6 is removed by wet etching from the DRAM circuit region 11, and massive residues 71 left behind on the protection film 6 are lifted off for removal.

7 Claims, 5 Drawing Sheets

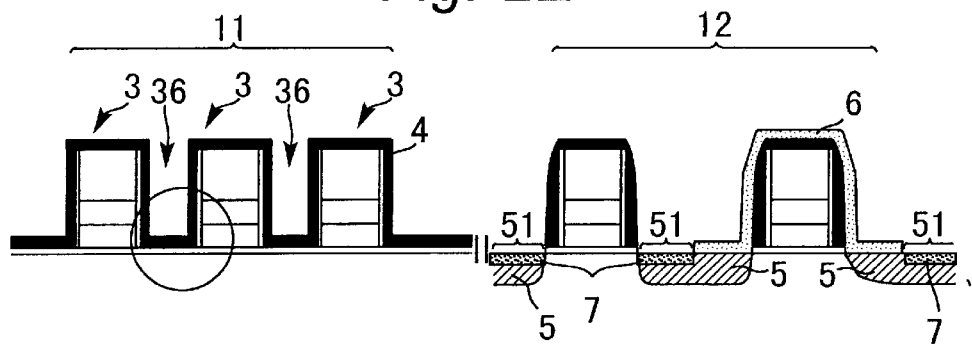
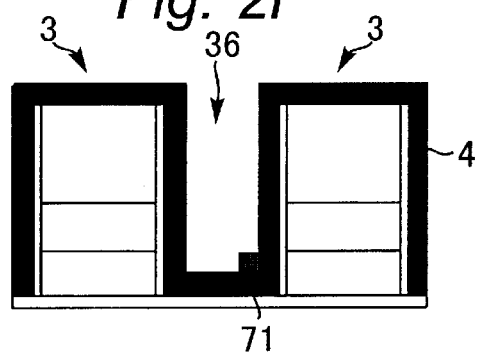
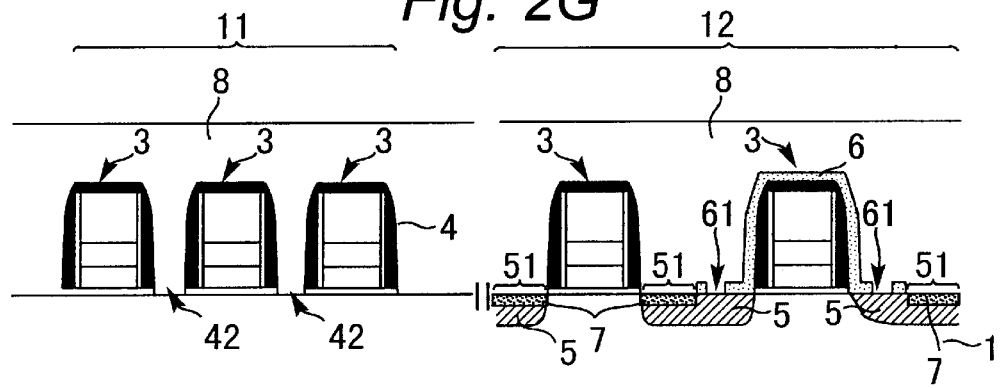
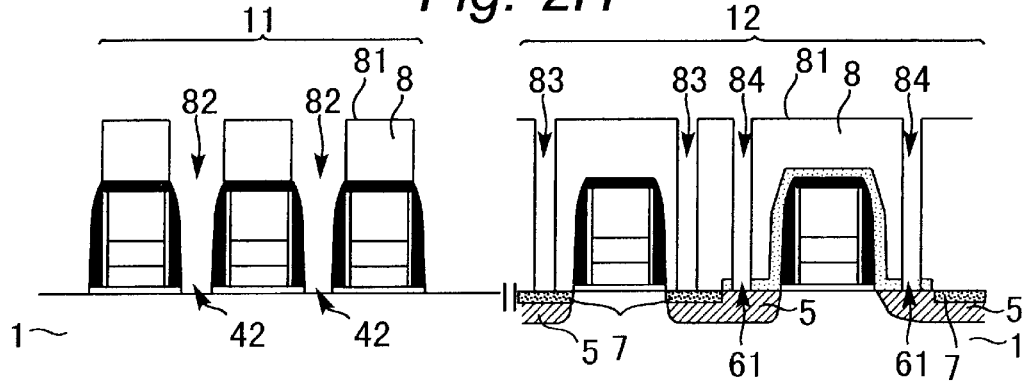

METHOD OF MANUFACTURING SEMICONDUCTOR DEVICE INCLUDING A STEP OF FORMING A SILICIDE LAYER, AND SEMICONDUCTOR DEVICE MANUFACTURED THEREBY

BACKGROUND OF THE INVENTION

1. Field of the Invention

The present invention relates to a method of manufacturing a semiconductor device and to a semiconductor device manufactured thereby, and more particularly, to a technique for forming a silicide layer.

2. Description of the Background Art

Hybrid semiconductor device (system LSI) integrating DRAM and logic circuit so-called embedded DRAM (hereinafter called "eRAM") has been manufactured for some time. In the eRAM, it is customary to form a silicide layer, for example, composed of $CoSi_2$ in upper layer portion of a diffusion layer of the logic circuit. The silicide layer is provided to reduce the parasitic resistance and parasitic capacity in the diffusion layer of the logic circuit and to enhance the speed of circuit operation.

In the following, the conventional method of manufacturing a semiconductor device with a step of forming the silicide layer will be described.

FIGS. 2A to 2H are cross-sectional views for describing a conventional method of manufacturing a semiconductor device.

With reference to FIG. 2A, a gate oxide film 2 is formed on a semiconductor substrate 1 having unillustrated active regions and isolation regions formed thereon beforehand. Next, gate electrodes 3 are formed on the gate oxide film 2.

Here, the semiconductor substrate 1 comprises two kinds of regions: a region 11 (hereinafter called "DRAM circuit region") where DRAM circuits are formed, and a region 12 (hereinafter called "logic circuit region") where logic circuits are formed. The logic circuit region 12 may be a region where peripheral circuits of the DRAM circuit 11 are formed.

The gate electrodes 3 are formed by depositing a polycrystalline silicon film (hereinafter called "polysilicon film") 31, a tungsten silicide film 32, and a TEOS oxide film 33 in this sequence.

Next, as shown in FIG. 2B, the both sides of the gate electrodes 3 are oxidized by a few nanometers (corresponding to an oxide film 34 in FIG. 2B). Next, a first insulating film 4, for example a silicon nitride film, is formed all over the semiconductor substrate 1 by LPCVD (low pressure chemical vapor deposition) method.

Next, although not shown, a resist pattern is formed on the first insulating film 4. Further, the first insulating film 4 is removed except at the top and at the both sides of the gate electrodes 3 in the logic circuit region 12 by dry etching with the resist pattern used as a mask.

Thus, a sidewall insulating film 41, which is made of the first insulating film 4, is formed on the top and the both sides of the gate electrodes 3 in the logic circuit region 12, as shown in FIG. 2C.

Next, ions of impurities are implanted into the semiconductor substrate 1 with the first insulating film 4 and the sidewall insulating film 41 used as a mask.

Thus, source/drain regions 5, which are served as $n^+$-type (or $p^+$-type) diffusion layer, are formed in the semiconductor substrate 1 of the logic circuit region 12 (see FIG. 2C).

Next, a silicide layer is formed as follows.

With reference to FIG. 2D, a protection film 6 serving as silicide protection film, for example a TEOS oxide film, is formed all over the semiconductor substrate 1 by LPCVD method.

Next, although not shown, a resist pattern is formed on the protection film 6. Further, the protection film 6, is subjected to dry etching with the resist pattern used as a mask.

Thus, the protection film 6 is formed on the logic circuit region 12 except for certain gate electrodes 3a and except for specific regions 51 of the diffusion layer 5 around the certain gate electrodes 3a, as shown in FIG. 2D. Namely, the protection film, which is formed on the first insulating film 4 in the DRAM circuit region 11 and formed on the specific regions 51 and the certain gate electrodes 3a in the logic circuit region 12, is removed by dry etching.

Here, when the protection film 6 is removed from the DRAM circuit region 11, the first insulating film 4 formed in the preceding process still exists. Therefore, the first insulating film 4 is served as the silicide protection film, no silicide layer is formed on the semiconductor substrate 1 in the DRAM circuit region 11.

Next, as shown in FIG. 2E, a silicide layer 7, for example $CoSi_2$, is formed in an upper layer portion of the specific regions 51 of the diffusion layer 5 in the logic circuit region 12 by a known self-aligned silicide technique (hereinafter called "salicide technique").

Thus, the silicide layer 7 is formed in the diffusion layer 5 of the logic circuit region 12.

Next, as shown in FIG. 2G, openings 42 and 61, which are used as contacts (which will be described in detail later), are formed respectively in the first insulating film 4 of the DRAM circuit region 11 and in the protection film 6 of the logic circuit region 12 by photolithography and by dry etching. Next, an interlayer dielectric 8, for example a silicon oxide film, is formed by CVD method all over the semiconductor substrate 1 so as to cover all of the gate electrodes 3.

Next, although not shown, a resist pattern is formed on the interlayer dielectric 8.

Subsequently, as shown in FIG. 2H, contact holes 82, 83 and 84 are formed in the interlayer dielectric 8 by dry etching with the resist pattern as a mask. Here, the contact holes 82 extend from a surface 81 of the interlayer dielectric 8 to the semiconductor substrate 1 through the openings 42. The contact holes 83 extend from the surface 81 to the conductive layer 7. The contact holes 84 extend from the surface 81 to the diffusion layer 5 through the openings 61.

Finally, although not shown, capacitors and wirings are formed. Thus, a hybrid semiconductor device having DRAM circuits with logic circuits is manufactured.

However, in the conventional method, there are problems as follows.

In the conventional method, as shown FIG. 2F, massive residues 71 are remained on the surface of the protection film 6 and the first insulating film 4 after the formation of the silicide layer 7. In particular, as shown in FIG. 2F, the massive residues 71 are remained between the gate electrode gaps 36 in memory cells of the DRAM circuit region 11. Here, the gate electrode gap 36 is on the first insulating film 4 between the gate electrodes 3.

To the inventors' knowledge, no prior art has dealt with the massive residues 71 so far.

Under TRXRF (total reflection of X-ray fluorescence analysis method), the inventors confirmed, the massive residues 71 contain metal cobalt (Co) on the order of $10^{11}$ to $10^{12}$ atoms/cm$^2$.

The probable cause of the remains of the massive residues 71 will be described as follows. The amount of massive residues 71 is directly proportional to the amount of the substance removed by sputter etching. The sputter etching process is performed prior to formation of the silicide layer 7 in order to remove a naturally formed oxide film from the silicon surface of the semiconductor substrate (silicon substrate) 1. Silicon-rich portions are formed, for example, on the first insulating film 4 between the gate electrodes 3 (gate electrode gaps 36) in the DRAM circuit region 11 by the sputter etching process. These portions presumably turn into the massive residues 7, and the residues 7 are remained.

The massive residues 71 thus formed can become a major cause of metal contamination.

The massive residues 71, which are remained in such narrow spaces as the gate electrode gaps 36 in the DRAM circuit region 11, can cause short-circuits between contact plugs of adjacent bit lines. Such short-circuits result in faulty bits.

As shown in FIG. 2G, the massive residues 71 are not removed during formation of the contact openings 42 by dry etching. Therefore, although not shown, column-like residues could be formed in the openings 42 with the massive residues 71 acting as a mask.

Accordingly, the remains of the massive residues 71 have resulted in a number of problems including device malfunctions and a lowered yield rate.

SUMMARY OF THE INVENTION

The present invention has been conceived to solve the previously-mentioned problems and a general object of the present invention is to provide a novel and useful method of manufacturing a semiconductor device, and is to provide a semiconductor device manufactured thereby.

A more specific object of the present invention is to form a silicide layer in logic circuit region of a semiconductor substrate without remaining massive residues containing metal in DRAM circuit region of the semiconductor substrate.

According to one aspect of the present invention, in a method of manufacturing a semiconductor device, a gate insulating film is formed on the DRAM circuit region and the logic circuit region of said semiconductor substrate. Gate electrodes are formed on the gate insulating film. Sidewalls of the gate electrodes are oxidized. A first insulating film is formed all over the semiconductor substrate. A sidewall insulating film is leaved on the both sides of the gate electrodes by removing the first insulating film from the logic circuit region except sidewalls of the gate electrodes. A diffusion layer is formed in the semiconductor substrate of the logic circuit region by implanting ions with the first insulating film and the sidewall insulating film as a mask. A protection film is formed on the first insulating film in the DRAM circuit region and on the logic circuit region except for specific regions of the diffusion layer around certain gate electrodes. A conductive layer is formed in an upper layer portion of the specific regions of the diffusion layer. The protection film is removed from the first insulating film in the DRAM circuit region after finish the above process.

In the method of manufacturing a semiconductor device, the protection film is removed from the DRAM circuit region after formation of the conductive layer. Therefore, byproducts, which are formed on the protection film in the DRAM circuit region during the conductive layer forming process, could be removed reliably.

Other objects and further features of the present invention will be apparent from the following detailed description when read in conjunction with the accompanying drawings.

BRIEF DESCRIPTION OF THE DRAWINGS

FIGS. 2A to 2H are cross-sectional views for describing a conventional method of manufacturing a semiconductor device.

DETAILED DESCRIPTION OF THE PREFERRED EMBODIMENTS

Figure 1A:
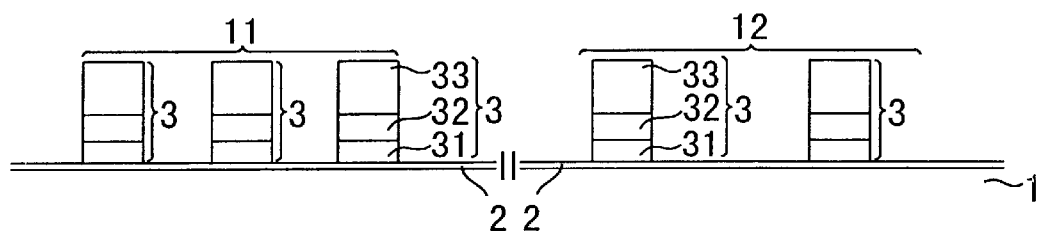
FIGS. 1A to 1J are cross-sectional views for describing a method of manufacturing a semiconductor device, according to the present invention.

In the following, principles and embodiments of the present invention will be described with reference to the accompanying drawings. The members and steps that are common to some of the drawings are given the same reference numerals and redundant descriptions therefore may be omitted.

FIGS. 1A to 1J are cross-sectional views for describing a method of manufacturing a semiconductor device, according to the present invention.

With reference to FIG. 1A, a gate oxide film 2 is formed on a semiconductor substrate 1 having unillustrated active regions and isolation regions formed thereon beforehand. Next, gate electrodes 3 are formed on the gate oxide film 2.

Here, the semiconductor substrate 1 comprises two kinds of regions: a region 11 (hereinafter called "DRAM circuit region") where DRAM circuits are formed, and a region 12 (hereinafter called "logic circuit region") where logic circuits are formed.

The logic circuit region 12 may be a region (hereinafter called "peripheral circuit region") where peripheral circuits of the DRAM circuit 11. The logic circuit region 12 and the peripheral circuit region have a similar device structure.

The gate electrodes 3 are formed by depositing a polycrystalline silicon film (hereinafter called "polysilicon film") 31, a tungsten silicide film 32, and a TEOS oxide film 33 in this sequence.

Figure 1B:
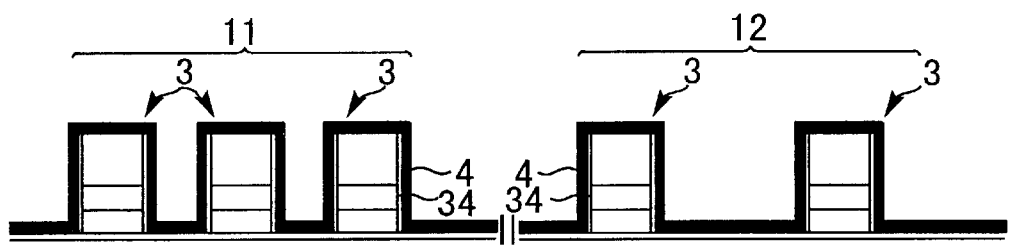

Next, as shown in FIG. 1B, the both sides of the gate electrodes 3 are oxidized by a few nanometers (corresponding to an oxide film 34 in FIG. 1B). Alternatively, the oxidation process may be replaced by deposition process of a silicon oxide film 34 a few nanometers thick by CVD method on the both sides of the gate electrodes 3.

Next, a first insulating film 4, for example a silicon nitride film, is formed all over the semiconductor substrate 1 by LPCVD (low pressure chemical vapor deposition) method.

Figure 1C:
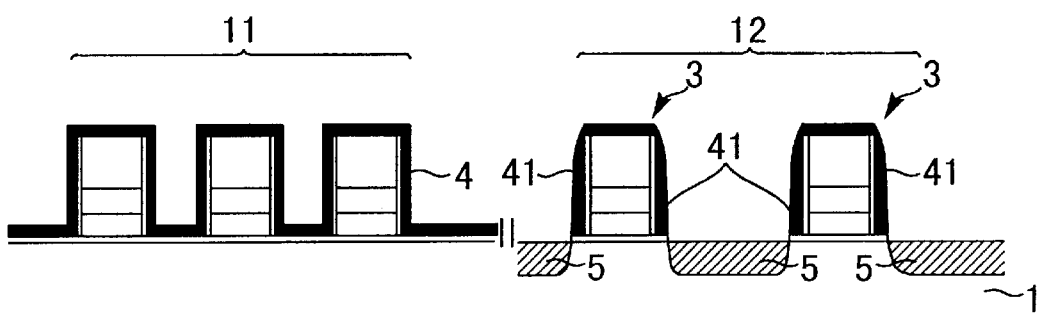

Next, although not shown, a resist pattern is formed on the first insulating film 4. Further, as shown in FIG. 1C, the first insulating film 4 is removed except the top and the both sides of the gate electrodes 3 in the logic circuit region 12 by dry etching with the resist pattern as a mask.

Namely, the first insulating film 4 is left intact on the both sides of the gate electrodes 3. Thus, a sidewall insulating film 41, which is made of the first insulating film 4, is formed on the both sides of the gate electrodes 3 in the logic circuit region 12.

Next, ions of impurities such as boron (B), phosphorus (P) or arsenic (As) are implanted into the semiconductor substrate 1 with the first insulating film 4 and the sidewall insulating film 41 as a mask. Thus, source/drain regions 5, which are served as n+-type (or p+-type) diffusion layer, are formed in the semiconductor substrate 1 of the logic circuit region 12 (see FIG. 1C).

Next, as described below, a silicide layer is formed by the self-aligned silicide technique (hereinafter called "salicide technique") in specific parts (which will be described in detail later) of the logic circuit region 12 on the semiconductor substrate 1.

Figure 1D:
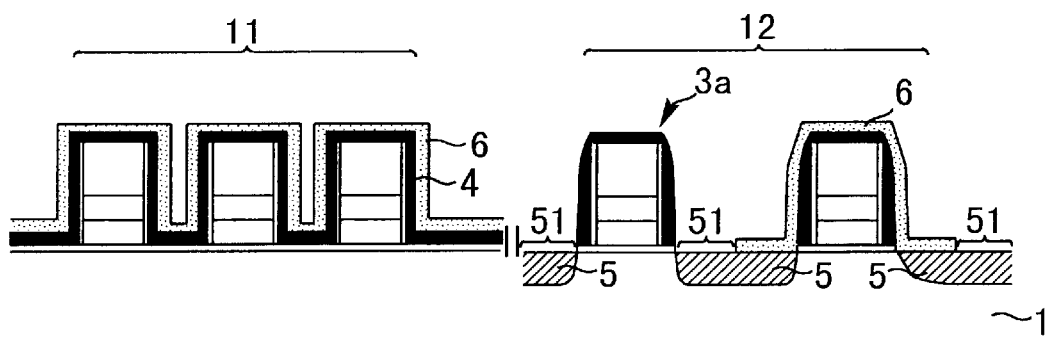

With reference to FIG. 1D, a TEOS oxide film 6 serving as a protection film is formed by LPCVD method all over the semiconductor substrate 1. The protection film (the TEOS oxide film) 6 is a silicide protection film so as to protect the regions where the silicide layer is not formed.

Next, although not shown, a resist pattern is formed on the protection film 6. Further, the protection film 6 is subjected to dry etching with the resist pattern as a mask.

Thus, the protection film 6 is formed on the first insulating film 4 in the DRAM circuit region 11 and on the logic circuit region 12 except for certain gate electrodes 3a and except for specific regions 51 of the diffusion layer 5 around the certain gate electrodes 3a, as shown in FIG. 1D. Namely, the protection film 6 is formed on the semiconductor substrate 1 except for the specific regions 51 in the logic circuit region 12.

Figure 1E:
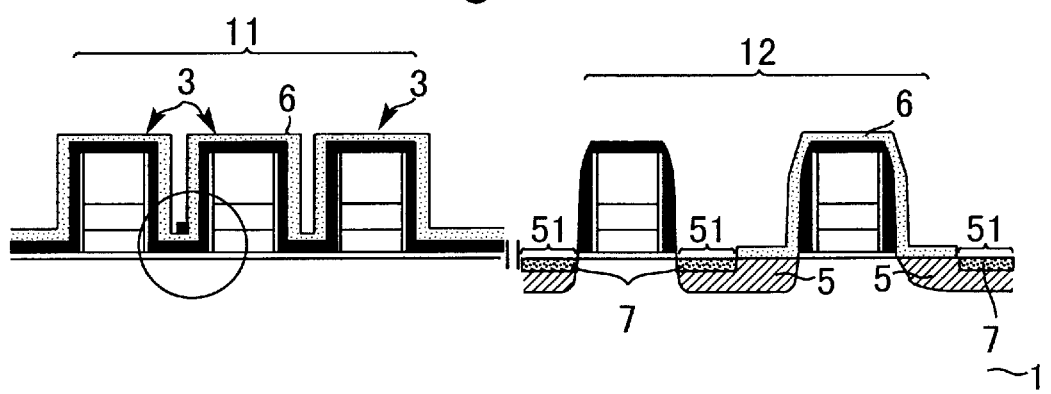

Next, as shown in FIG. 1E, a conductive layer 7, for example $CoSi_2$, is formed in an upper portion of the specific regions 51 by the known salicide technique.

Figure 1F:
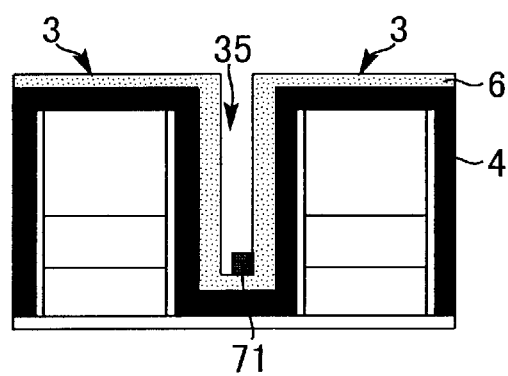

Here, as shown in FIG. 1F, massive residues 71 as byproducts, which contain cobalt (Co) for example, are formed on the protection film 6 between gate electrode gaps 35 (narrow spaces) in the DRAM circuit region 11. The massive residues 71 remained on the protection film 6 during formation of the conductive layer 7.

Figure 1G:
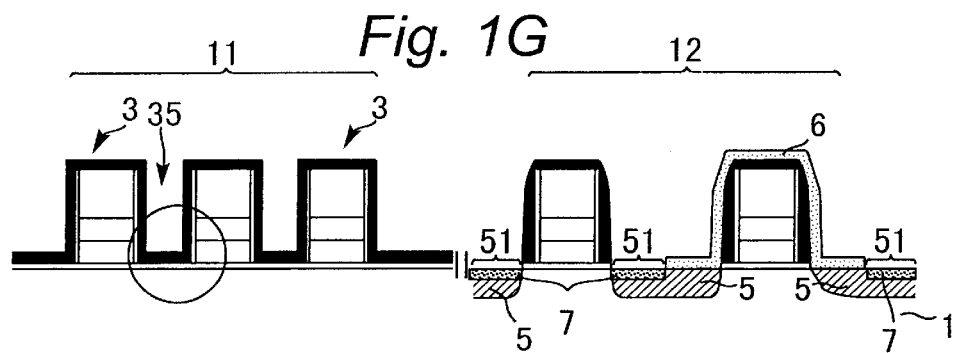

Next, as shown in FIG. 1G, the protection film 6 is removed by wet etching from the first insulating film 4 in the DRAM circuit region 11.

Figure 1H:
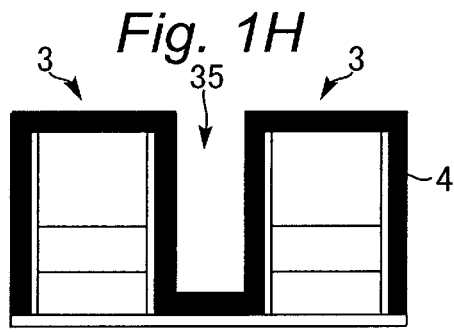

Here, as shown in FIG. 1H, the massive residues 71 is removed from the gate electrode gaps 35 in the DRAM circuit region 11.

Namely, the massive residues 71 are lift off with the protection film 6 by the wet etching. The first insulating film 4, which is formed under the protection film 6, is served as a stopper during the wet etching.

In the manner described above, the silicide layer 7 is formed on the diffusion layer 5 in the logic circuit region 12.

Figure 1I:
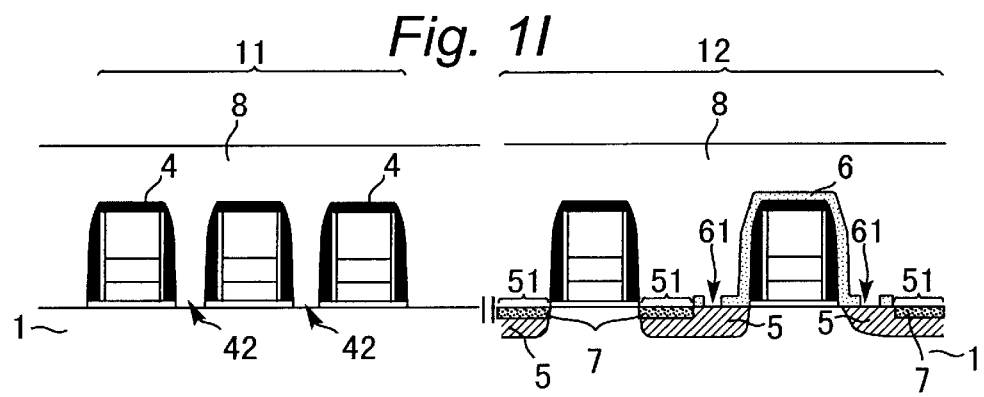

Next, as shown in FIG. 1I, openings 42 and 61, which are used as contacts (which will be described in detail later), are formed respectively in the first insulating film 4 on the DRAM circuit region 11 and in the protection film 6 on the logic circuit region 12 by photolithography and by dry etching.

Next, an interlayer dielectric 8, for example a silicon oxide film, is formed by CVD method all over the semiconductor substrate 1 so as to cover all of the gate electrodes 3.

Next, although not shown, a resist pattern is formed on the interlayer dielectric 8.

Figure 1J:
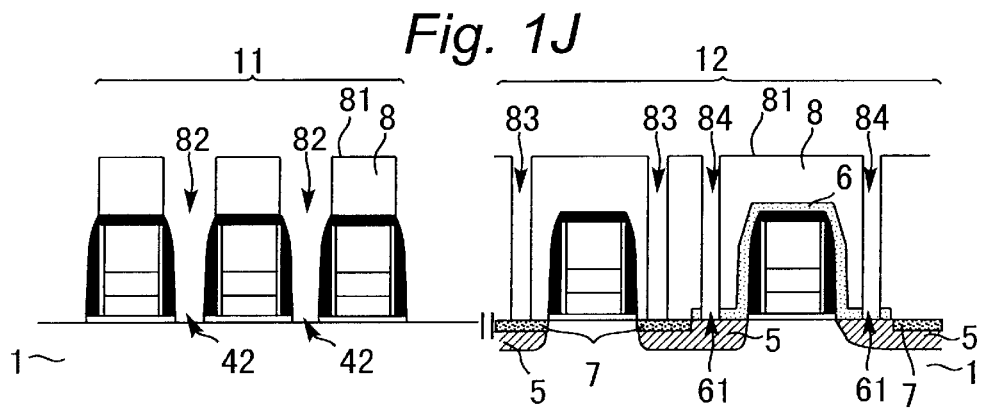
Figure 2A:
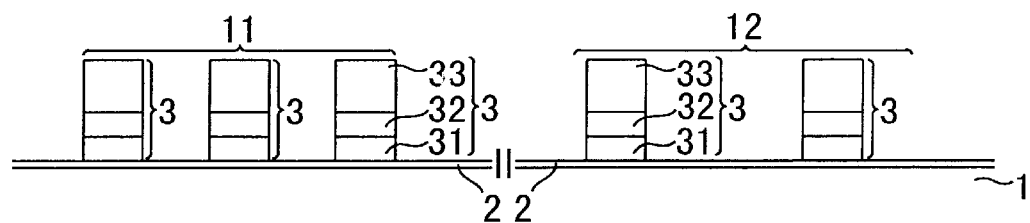
Figure 2B:
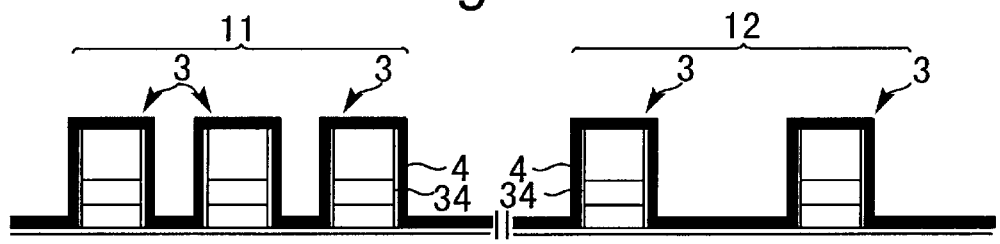
Figure 2C:
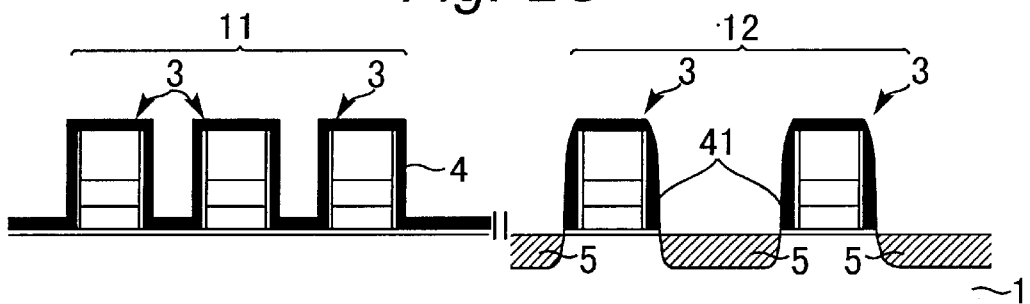
Figure 2D:
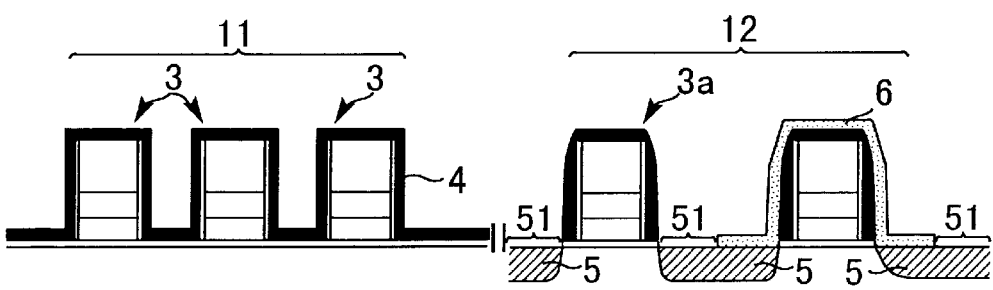

Subsequently, as shown FIG. 1J, contact holes 82, 83 and 84 are formed in the interlayer dielectric 8 by dry etching with the resist pattern as a mask Specifically, the contact holes 82 extend from a surface 81 of the interlayer dielectric 8 to the semiconductor substrate 1 through the openings 42. The contact holes 83 extend from the surface 81 to the conductive layer 7. The contact holes 84 extend from the surface 81 to the diffusion layer 5 through the openings 61.

Finally, although not shown, capacitors and wirings are formed. Thus, a hybrid semiconductor device having DRAM circuits with logic circuits is manufactured.

As described above, in the method of manufacturing a semiconductor device according to the present embodiment, the gate insulating film 2 is formed on the semiconductor substrate 1 having the DRAM circuit region 11 and logic circuit region 12. Next, the gate electrodes 3 are formed on the gate insulating film 2. Further, the both sides of the gate electrodes 3 are oxidized.

Next, in the logic circuit region 12, the sidewall insulating film 41 made of the first insulating film 4 is formed on the both sides of the gate electrodes 3. Next, the diffusion layer 5 is formed by implanting the impurity ions into the semiconductor substrate 1.

Further, the protection film 6 is formed on the first insulating film 4 in the DRAM circuit region 11 and on the logic circuit region 12 except for the specific regions 51 around the certain gate electrodes 3. Next, a silicide layer serving as the conductive layer 7 is formed in an upper layer portion of the specific regions 51 in the logic circuit region 12.

Next, the protection film 6 is removed by wet etching from the DRAM circuit region 11.

According to the method, the protection film 6 is removed by wet etching from the DRAM circuit region 11 after finishing the formation of the silicide layer (for example $CoSi_2$) serving as the conductive layer 7 in the logic circuit region 12.

Therefore, when the protection film 6 is removed from the DRAM circuit region 11, the massive residues 71, which contain the metal cobalt (Co) and is remained on the protection film 6, are lifted off reliably.

The massive residues 71 are removed from the gate electrode gaps 35 in the DRAM circuit region 11. Therefore, short-circuits between contact plugs in the region 11 could be prevented. Moreover, device malfunctions could be reduced, and a high yield rate could be attained.

A semiconductor device manufactured by the above-described method does not have device defects such as faulty bits caused by the massive residues 71. Therefore, a reliability of the semiconductor device could be improved.

The silicide layer may be $TiSi_2$ or $MoSi_2$ instead of $CoSi_2$.

This invention, when practiced illustratively in the manner described above, provides the following major effects:

According to a first aspect of the present invention, the protection film is removed from the DRAM circuit region after formation of the conductive layer. Therefore, byproducts, which are formed on the protection film in the DRAM circuit region during the conductive layer forming process, could be removed reliably.

In a preferred variation of the aspect of the present invention, the protection film could be removed by wet etching reliably.

In a preferred variation of the aspect of the present invention, the massive residues, which are remained on the protection film in the DRAM circuit region, are removed reliably in the step of removing the protection film.

In a preferred variation of the aspect of the present invention, the massive residues, which are remained on the protection film between the gate electrodes in the DRAM circuit region, could be removed reliably.

In a preferred variation of the aspect of the present invention, the massive residues, which are remained between the gate electrodes in the DRAM circuit region, could be removed reliably after formation of the silicide layer on the logic circuit region.

In a preferred variation of the aspect of the present invention, since the massive residues, which contains metal and which are remained between the gate electrodes in the DRAM circuit region, could be removed reliably, short-circuits between the gate electrodes could be prevented.

In a preferred variation of the aspect of the present invention, a semiconductor device, which is manufactured by the method of manufacturing a semiconductor device, could be attained a high reliability.

Further, the present invention is not limited to these embodiments, but variations and modifications may be made without departing from the scope of the present invention.

The entire disclosure of Japanese Patent Application No. 2000-238525 filed on Aug. 7, 2000 containing specification, claims, drawings and summary are incorporated herein by reference in its entirety.

What is claimed is:

1. A method of manufacturing a semiconductor device having DRAM circuit region and logic circuit region furnished on a semiconductor substrate, the method comprising the steps of:

forming a gate insulating film on said DRAM circuit region and said logic circuit region of said semiconductor substrate;

forming gate electrodes on said gate insulating film;

oxidizing sidewalls of said gate electrodes;

forming a first insulating film all over said semiconductor substrate;

leaving a sidewall insulating film on the both sides of said gate electrodes by removing said first insulating film from said logic circuit region except sidewalls of said gate electrodes;

forming a diffusion layer in said semiconductor substrate in said logic circuit region by implanting ions with said first insulating film and said sidewall insulating film used as a mask;

forming a protection film on said first insulating film in said DRAM circuit region and on said logic circuit region except for regions of said diffusion layer around some gate electrodes; and forming a conductive layer in an upper layer portion of said regions of said diffusion layer;

wherein a step of removing said protection film on said first insulating film in said DRAM circuit region is carried out after finishing the above steps.

2. The method of manufacturing a semiconductor device according to claim 1, wherein in said step of removing said protection film, said protection film is removed by wet etching.

3. The method of manufacturing a semiconductor device according to claim 2, wherein in said step of removing said protection film, massive residues, which remained on said protection film, are removed by a lift-off technique besides removal of said protection film.

4. The method of manufacturing a semiconductor device according to claim 3, wherein in said step of removing said protection film, said massive residues, which remained on said protection film between said gate electrodes in said DRAM circuit region, are removed.

5. The method of manufacturing a semiconductor device according to claim 4, wherein in said step of forming said conductive layer, a silicide layer serving as said conductive layer is formed in said upper layer portion of said regions of said diffusion layer by a self-aligned suicide technique.

6. The method of manufacturing a semiconductor device according to claim 5, wherein in said step of forming said conductive layer, said silicide layer, which is constituted by any one of $CoSi_2$, $TiSi_2$ and $MoSi_2$, is formed by a said self-aligned silicide technique.

7. The method of manufacturing a semiconductor device according to claim 6, wherein in said step of removing said protection film, said massive residues, which remained on said protection film between said gate electrodes in said DRAM circuit region and which contain any one of the metals CO, Ti and Mo, are removed.

* * * * *